(12) United States Patent
He et al.

(10) Patent No.: US 9,647,092 B2
(45) Date of Patent: May 9, 2017

(54) METHOD AND STRUCTURE OF FORMING FINFET ELECTRICAL FUSE STRUCTURE

(71) Applicant: INTERNATIONAL BUSINESS MACHINES CORPORATION, Armonk, NY (US)

(72) Inventors: Hong He, Schenectady, NY (US); Juntao Li, Cohoes, NY (US); Chih-Chao Yang, Glenmont, NY (US); Yunpeng Yin, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/984,445

(22) Filed: Dec. 30, 2015

(65) Prior Publication Data

US 2016/0315175 A1    Oct. 27, 2016

Related U.S. Application Data

(63) Continuation of application No. 14/694,306, filed on Apr. 23, 2015.

(51) Int. Cl.
| | |
|---|---|
| H01L 23/525 | (2006.01) |
| H01L 23/62 | (2006.01) |
| H01L 29/66 | (2006.01) |
| H01L 21/3065 | (2006.01) |
| H01L 21/324 | (2006.01) |
| H01L 21/768 | (2006.01) |
| H01L 27/12 | (2006.01) |
| H01L 29/78 | (2006.01) |

(52) U.S. Cl.
CPC .... *H01L 29/66795* (2013.01); *H01L 21/3065* (2013.01); *H01L 21/324* (2013.01); *H01L 21/76897* (2013.01); *H01L 23/5256* (2013.01); *H01L 27/1211* (2013.01); *H01L 29/66545* (2013.01); *H01L 29/785* (2013.01)

(58) Field of Classification Search
CPC ......... H01L 21/823431; H01L 23/5256; H01L 27/11206
USPC .......................................................... 438/586
See application file for complete search history.

(56) References Cited

U.S. PATENT DOCUMENTS

| | | |
|---|---|---|
| 4,796,075 A | 1/1989 | Whitten |
| 5,854,510 A | 12/1998 | Sur, Jr. et al. |
| 6,420,217 B1 | 7/2002 | Kalnitsky et al. |

(Continued)

OTHER PUBLICATIONS

C. Kothandaraman et al., "Electrically programmable fuse (eFUSE) using electromigration in silicides," IEEE Electron Device Letters, vol. 23, No. 9, 2002, pp. 523-525.

(Continued)

*Primary Examiner* — Moazzam Hossain
(74) *Attorney, Agent, or Firm* — Scully, Scott, Murphy & Presser, P.C.; Daniel P. Morris, Esq.

(57) ABSTRACT

An e-Fuse structure is provided on a surface of an insulator layer of a semiconductor-on-insulator substrate (SOI). The e-Fuse structure includes a first metal semiconductor alloy structure of a first thickness, a second metal semiconductor alloy structure of the first thickness, and a metal semiconductor alloy fuse link is located laterally between and connected to the first and second metal semiconductor alloy structures. The metal semiconductor alloy fuse link has a second thickness that is less than the first thickness.

10 Claims, 7 Drawing Sheets

(56) References Cited

U.S. PATENT DOCUMENTS

| | | |
|---|---|---|
| 7,087,499 B2 | 8/2006 | Rankin et al. |
| 7,388,273 B2 | 6/2008 | Burr et al. |
| 8,030,736 B2 | 10/2011 | Booth, Jr. et al. |
| 8,053,809 B2 | 11/2011 | Cheng et al. |
| 8,400,813 B2 | 3/2013 | Lee |
| 8,471,296 B2 * | 6/2013 | Cheng ................ H01L 23/5256 257/209 |
| 9,041,151 B2 * | 5/2015 | Lavoie ................... H01L 28/00 257/529 |
| 9,502,425 B2 * | 11/2016 | Choi ................ H01L 27/11206 257/529 |
| 2005/0214982 A1 * | 9/2005 | Wu ........................ H01L 21/84 438/149 |
| 2007/0029576 A1 * | 2/2007 | Nowak .................. H01L 27/10 257/209 |
| 2008/0105948 A1 | 5/2008 | Jeng et al. |
| 2008/0157201 A1 | 7/2008 | Marshall |
| 2009/0026574 A1 | 1/2009 | Kim et al. |
| 2009/0206446 A1 | 8/2009 | Russ et al. |
| 2009/0243032 A1 | 10/2009 | Chen |
| 2010/0244144 A1 | 9/2010 | Hsueh et al. |
| 2011/0156857 A1 | 6/2011 | Kurz et al. |
| 2013/0001741 A1 * | 1/2013 | Mann .................. H01L 23/5256 257/529 |
| 2013/0148409 A1 | 6/2013 | Chung |
| 2013/0187206 A1 | 7/2013 | Mor et al. |
| 2014/0353796 A1 * | 12/2014 | Lavoie ................... H01L 28/00 257/529 |
| 2015/0097266 A1 * | 4/2015 | Li ....................... H01L 23/5256 257/529 |
| 2015/0279478 A1 | 10/2015 | Hall |
| 2016/0200137 A1 | 7/2016 | Walter |

OTHER PUBLICATIONS

R. F. Rizzolo et al., "IBM System z9 eFUSE applications and methodology." IBM Journal of Research and Development, vol. 51, No. 1-2, 2007, pp. 65-75.

List of IBM Patents or Patent Applications Treated as Related, dated Dec. 30, 2015, 2 pages.

Office Action dated Jan. 3, 2017 received, U.S. Appl. No. 14/694,306 copy not enclosed.

* cited by examiner

US 9,647,092 B2

METHOD AND STRUCTURE OF FORMING FINFET ELECTRICAL FUSE STRUCTURE

BACKGROUND

The present application relates to a semiconductor structure and a method of forming the same. More particularly, the present application relates to an electrical fuse (e-Fuse) that has a thin fuse link that is located laterally between, and in contact with, an anode and a cathode.

In addition to transistors, resistors, capacitors, and diodes, semiconductor devices also often contain fuses. These fuses may be used for several purposes. For example, fuses may be used within semiconductor devices for purposes of introducing or deleting customized circuit elements into a semiconductor device. In addition, fuses within semiconductor devices may be used for purposes of severing a non-operative portion of the semiconductor device and replacing that non-operative portion with a redundant semiconductor device fabricated on the same semiconductor substrate. Fuse elements may also be used to provide direct alternative current (DAC) trimming.

Selected fuses are usually blown by either a laser beam, or an electrical current, depending on the design of the fuse/device. In an electrical fuse design, electronically programmable fuses are blown by passing a current through the fuse link. The electrical current then causes a permanent change to the resistance of the fuse. The fuses that are blown are selected by one or more programming methods, which are generally known to those skilled in the art. Electronically programmable fuses, also called e-Fuses, have become popular because of the circuit and systems design flexibility that they provide.

e-Fuses are used in semiconductor industry to implement array redundancy, field programmable arrays, analog component trimming circuits and even as chip identification circuits. Dog-bone shaped e-Fuses containing a fuse link are known. In such conventional dog-bone shaped e-Fuses, the fuse link dimension is limited by the allowable photolithographic minimal dimensions.

While e-Fuses are thus desirable within semiconductor device design and fabrication and provide an essential tool for cost effective and efficient semiconductor device design and fabrication, e-Fuses are not entirely without problems. For example, programming of prior art e-Fuses typically takes a substantial amount of current, which is undesirable in current technology node devices using low driving current. In addition, programming transistors takes up space in a semiconductor chip as well as power consumption. In view of the above, there is a continued need to provide e-Fuses in which the fuse link is much smaller than conventional photolithographic minimum dimensions and thus the amount of electrical current that is needed to blow the e-Fuse can be substantially reduced as compared to a conventional e-Fuse design.

SUMMARY

In one aspect of the present application, a semiconductor structure is provided that includes an e-Fuse structure. The e-Fuse structure is located on a surface of an insulator layer of a semiconductor-on-insulator substrate (SOI). The e-Fuse structure comprises a first metal semiconductor alloy structure of a first thickness, a second metal semiconductor alloy structure of the first thickness, and a metal semiconductor alloy fuse link located laterally between and connected to the first and second metal semiconductor alloy structures. The metal semiconductor alloy fuse link has a second thickness that is less than the first thickness.

In another aspect of the present application, a method of forming a semiconductor structure is provided. In one embodiment of the present application, the method includes forming a plurality of semiconductor fins extending upwards from a surface of an insulator layer. At least a pair of spaced apart sacrificial gate structures is formed straddling different portions of each semiconductor fin of the plurality of semiconductor fins. A portion of each semiconductor fin not protected by the sacrificial gate structures is then recessed to provide a recessed semiconductor fin portion. Each recessed semiconductor fin portion is converted into a metal semiconductor alloy fuse link. Next, each sacrificial gate structure is removed to expose remaining portions of each semiconductor fin. The remaining portions of each semiconductor fin are then converted into metal semiconductor alloy structures. Each metal semiconductor alloy structure that is formed has a first thickness and each metal semiconductor alloy fuse link that is formed has a second thickness that is less than the first thickness, and each metal semiconductor alloy fuse link is located laterally between one of the metal semiconductor alloy structures and another of the metal semiconductor alloy structures.

DETAILED DESCRIPTION

Figure 1:
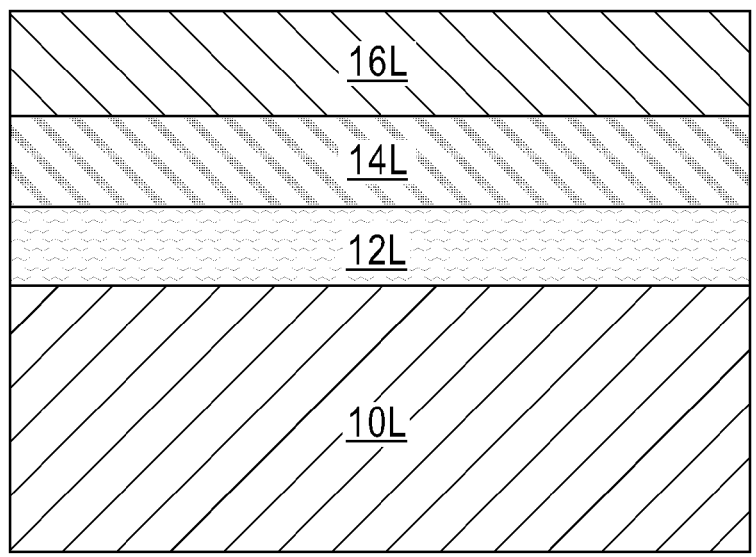
FIG. 1 is a cross sectional view of an exemplary semiconductor structure including a hard mask layer located on a top semiconductor material layer of a semiconductor-on-insulator (SOI) substrate that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

An e-Fuse structure is disclosed that includes a first metal semiconductor alloy structure of a first thickness, a second metal semiconductor alloy structure of the first thickness, and a metal semiconductor alloy fuse link located between and connected to the first and second metal semiconductor alloy structures. The metal semiconductor alloy fuse link has a second thickness that is less than the first thickness; the metal semiconductor alloy fuse link can be referred to as an ultra-thin fuse link since it can have a thickness less than 2 nm and, in some embodiments, a width from 8 nm to 12 nm.

The e-Fuse structure of the present application can be formed utilizing a method that is compatible with current FinFET processing flows. The method of the present application can be integrated with the CMOS devices with no additional processing steps and at low fabrication cost. Moreover, the metal semiconductor alloy fuse link of the present application can be made using current lithography technology with no additional mask.

The implementation of the e-Fuse structure of the present application can result in a significant area savings inside a semiconductor chip. The length and thickness of the metal semiconductor alloy fuse link of the present application can be controlled depending on the gate pitch and fin recess conditions, which in turn can provide better programmable capabilities. The reduced dimensions of the metal semiconductor alloy fuse link of the present application can help reduce the programming voltage, which is preferable for current CMOS with low voltage operation.

Referring first to FIG. 1, there is illustrated an exemplary semiconductor structure that can be employed in accordance with an embodiment of the present application. As is shown, the exemplary semiconductor structure of FIG. 1 includes, from bottom to top, a semiconductor-on-insulator (SOI) substrate (10L, 12L, 14L) and a hard mask layer 16L. The hard mask layer 16L is located on a topmost surface, i.e., a top semiconductor material layer 14L, of the SOI substrate.

In addition to the top semiconductor material layer 14L, the SOI substrate also includes a handle substrate 10L and an insulator layer 12L.

In some embodiments of the present application, the handle substrate 10L and the topmost semiconductor material layer 14L of the SOI substrate may both comprise a semiconductor material. The term "semiconductor material" is used throughout the present application to denote any material that has semiconductor properties. Examples of semiconductor materials that can be used in the present application include, but are not limited to, Si, Ge, SiGe, SiC, SiGeC, III/V compound semiconductors such as, for example, InAs, InP, InAsP, and GaAs, II/VI compound semiconductor materials or any multilayered stack thereof. In some embodiments of the present application, the handle substrate 10L and the topmost semiconductor material layer 14L of the SOI substrate may comprise a same semiconductor material. In one example, the handle substrate 10L and the topmost semiconductor material layer 14L of the SOI substrate are both comprised of silicon. In other embodiments of the present application, the handle substrate 10L and the topmost semiconductor material layer 14L of the SOI substrate may comprise a different semiconductor material. In one example, the handle substrate 10L is comprised of silicon and the topmost semiconductor material layer 14L of the SOI substrate is comprised of a silicon germanium alloy. In some embodiments, the handle substrate 10L is a non-semiconductor material including, for example, a dielectric material and/or a conductive material. In yet other embodiments, the handle substrate 10L can be omitted.

In some embodiments, the handle substrate 10L and the topmost semiconductor material layer 14L of the SOI substrate may have the same or different crystal orientation. Exemplary crystal orientations include {100}, {110}, or {111}. Other crystallographic orientations besides those specifically mentioned can also be used in the present application. In some embodiments, the handle substrate 10L of the SOI substrate may be a single crystalline semiconductor material, a polycrystalline material, or an amorphous material. The topmost semiconductor material layer 14L of the SOI substrate is a single crystalline semiconductor material.

The insulator layer 12L of the SOI substrate may be a crystalline or non-crystalline oxide or nitride. In one embodiment, the insulator layer 12L is an oxide such as, for example, silicon dioxide. In another embodiment, the insulator layer 12L is a nitride such as, for example, silicon nitride or boron nitride. In yet another embodiment, the insulator layer 12L comprises a multilayered stack of insulating oxides and nitrides. In one example, the insulator layer 12L comprises, in any order, boron nitride and silicon dioxide.

The SOI substrate (10L, 12L, 14L) may be formed utilizing standard processes including for example, SIMOX (Separation by IMplantation of OXygen) or layer transfer. When a layer transfer process is employed, an optional thinning step may follow the bonding of two semiconductor wafers together.

The thickness of topmost semiconductor material layer 14L of the SOI substrate is typically from 10 nm to 100 nm, although other thicknesses that are lesser than, or greater than, the aforementioned thickness range may also be used for the thickness of the topmost semiconductor material layer 14L of the SOI substrate. The insulator layer 12L of the SOI substrate typically has a thickness from 1 nm to 200 nm, although other thicknesses that are lesser than, or greater than, the aforementioned thickness range for the insulator layer 12L of the SOI substrate can be used. The thickness of the handle substrate 10L of the SOI substrate is inconsequential to the present application.

The hard mask layer 16L that can be employed is a contiguous layer that covers the entirety of the topmost surface of the SOI substrate (10L, 12L, 14L). By "contiguous" it is meant that one material or stack of materials entirely covers an underlying material or underlying stack of materials. The hard mask layer 16L that can be employed in the present application may include a hard mask material such as, for example, a semiconductor oxide, a semiconductor nitride and/or a semiconductor oxynitride. In one embodiment, the hard mask material that can be used in providing the hard mask layer 16L can be comprised of silicon dioxide. In another embodiment, the hard mask material that can be used in providing the hard mask layer 16L can be comprised of silicon nitride. In yet another embodiment, the hard mask material that can be used in providing the hard mask layer 16L can be a stack comprised of, in any order, silicon dioxide and silicon nitride.

In some embodiments of the present application, the hard mask material that can be used in providing the hard mask layer 16L can be formed by a deposition process such as, for example, chemical vapor deposition (CVD) or plasma enhanced chemical vapor deposition (PECVD). In other embodiments, the hard mask material that can be used in providing the hard mask layer 16L can be formed by a thermal process such as, for example, thermal oxidation and/or thermal nitridation. In yet other embodiments, the hard mask material that can be used in providing the hard mask layer 16L can be formed by a combination of a deposition process and a thermal process. The thickness of the hard mask material that can be used in providing the hard mask layer 16L can range from 2 nm to 10 nm, although other thickness that are lesser than, or greater, than the aforementioned thickness range can be used for the hard mask layer 16L.

Figure 2:
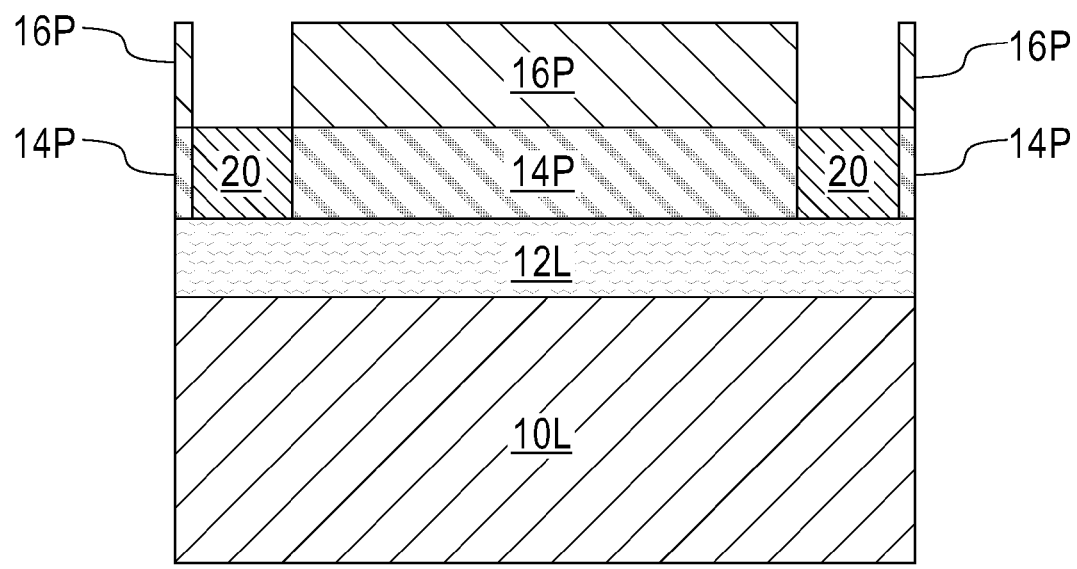
FIG. 2 is a cross sectional view of the exemplary semiconductor structure of FIG. 1 after forming an isolation structure within the topmost semiconductor material layer of the SOI substrate.

Referring now to FIG. 2, there is illustrated the exemplary semiconductor structure of FIG. 1 after forming an isolation structure 20 within the topmost semiconductor material layer 14L of the SOI substrate (10L, 12L, 14L). The isolation structure 20 that is formed surrounds a remaining portion of the topmost semiconductor layer 14L of the SOI substrate. The remaining portion of the topmost semiconductor material layer 14L can be referred to herein as a semiconductor material portion 14P. Although a single semiconductor material portion 14P is described and illustrated, a plurality of semiconductor material portions 14P can be formed to the right and left of semiconductor material portion 14P that is illustrated in FIG. 2. The other semiconductor material portions can be processed to include FinFET devices utilizing any conventional FinFET forming process (including a gate last or gate first) known to those skilled in the art. These semiconductor material portions can be processed either before or after forming the e-Fuse structure of the present application.

The isolation structure 20 has a bottommost surface that contacts a topmost surface of the insulator layer 12L of the SOI substrate and sidewall surfaces that contact each remaining semiconductor material portion. A topmost surface of the isolation structure 20 may or may not be coplanar with a topmost surface of each remaining semiconductor material portion. FIG. 2 illustrates an embodiment of the present application in which the isolation structure 20 has a topmost surface that is coplanar with a topmost surface of each remaining semiconductor material portion including semiconductor material portion 14P.

The isolation structure 20 may also be referred to herein as a trench isolation structure since it is formed within a trench that is provided to the topmost semiconductor material layer 14L of the SOI substrate. The isolation structure 20 can be formed by first patterning the hard mask layer 16L and the topmost semiconductor material layer 14L of the SOI substrate. The patterning of the hard mask layer 16L and the topmost semiconductor material layer 14L may be performed by lithography and etching. Lithography includes depositing a photoresist material (not shown) atop the hard mask layer 16L, patterning the photoresist material by exposing the photoresist material to a desired pattern (i.e., trench pattern) of irradiation, and developing the exposed photoresist material utilizing a conventional resist developer. Etching may include dry etching (i.e., reactive ion etching, ion beam etching, plasma etching, or laser ablation) and/or a chemical wet etch process. In one embodiment, a single etch can be used to transfer the pattern into the hard mask layer 16L and then into the topmost semiconductor material layer 14L. In another embodiment, a first etch is used to transfer the pattern into the hard mask layer 16L, and then a second etch is used to transfer the pattern into the topmost semiconductor material layer 14L. Following any of the etching processes, the patterned photoresist material can be removed utilizing a resist stripping process such as, for example, ashing. The portions of the hard mask layer 16L that remain after the pattern transfer can be referred to herein as hard mask portions 16P.

After forming the trench into the topmost semiconductor material layer 14L, a trench dielectric material is formed into the trench. The trench dielectric material that provides the isolation structure 20 can include one of the materials mentioned above for the hard mask layer 16L. In some embodiments, the trench dielectric material is different in composition from the hard mask material that provides the hard mask layer 16L. In one example, and when the hard mask layer 16L comprises silicon nitride, the trench dielectric material that provides the isolation structure 20 may comprise silicon dioxide. The trench dielectric material that provides the isolation structure 20 may be formed by a deposition process such as, for example, chemical vapor deposition (CVD) or plasma enhanced chemical vapor deposition (PECVD). In some embodiments, a densification process may follow the deposition of the trench dielectric material. In yet other embodiments, an etch back process may follow the deposition of the trench dielectric material.

Figure 3:
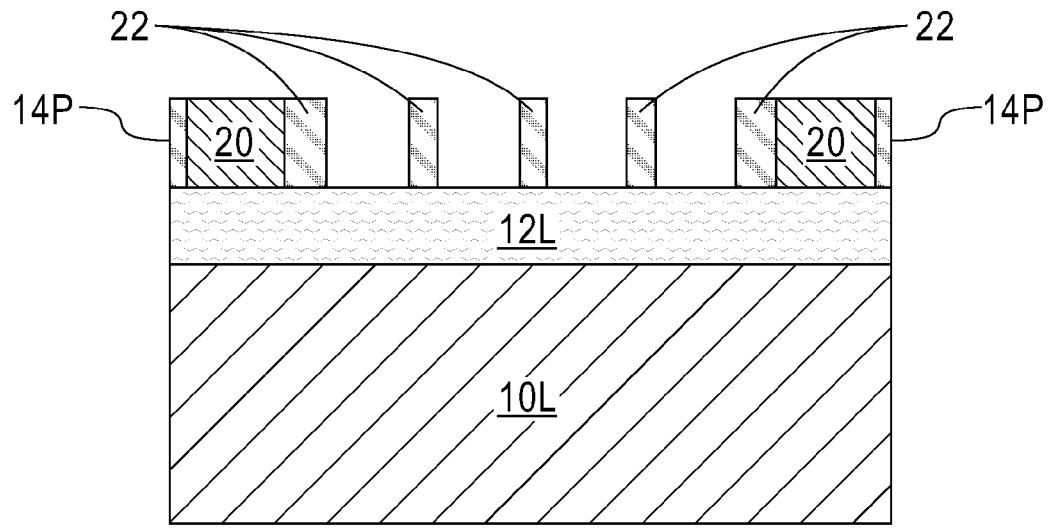
FIG. 3 is a cross sectional view of the exemplary semiconductor structure of FIG. 2 after removing remaining portions of the hard mask layer and forming semiconductor fins within a remaining portion of the top semiconductor material layer.

Referring now to FIG. 3, there is illustrated the exemplary semiconductor structure of FIG. 2 after removing remaining portions of the hard mask layer 16L (i.e., each hard mask portion 16P) and forming semiconductor fins 22 within a remaining portion of the top semiconductor material layer 14L (i.e., semiconductor material portion 14P). Each semiconductor fin 22 that is formed comprises a remaining portion of the semiconductor material portion 16P and can be formed by patterning the semiconductor material portion 14P. The hard mask portions 16P can be removed prior to, or after, semiconductor fin 22 formation.

In some embodiments, the hard mask portions 16P can be removed by a planarization process such as, for example, chemical mechanical polishing (CMP) and/or grinding. In other embodiments, the hard mask portions 16P can be removed by an etch back process.

In one embodiment, the patterning process used to define each semiconductor fin 22 may include a sidewall image transfer (SIT) process; similar patterning may take place in the other semiconductor material portions. The SIT process includes forming a contiguous mandrel material layer (not shown) on the topmost surface of the semiconductor material portion 14P (or hard mask portions 16P, if not previously removed). The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of amorphous silicon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. The thickness of the contiguous mandrel material layer (not shown) can be from 50 nm to 300 nm, although lesser and greater thicknesses can also be employed. Following deposition of the contiguous mandrel material layer (not shown), the contiguous mandrel material layer (not shown) can be patterned by lithography and etching to form a plurality of mandrel structures (also not shown).

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride, amorphous carbon or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching. Since the dielectric spacers are used in the SIT process as an etch mask, the width of the each dielectric spacer can be used to determine the width of each semiconductor fin 22.

After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers into the semiconductor material portion 14P that provides the semiconductor fin 22. The pattern transfer may be achieved by an etching process. Examples of etching processes that can used to transfer the pattern may include dry etching (i.e., reactive ion etching, plasma etching, ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

In some embodiments, lithography and etching can be used to define the semiconductor fins 22. Lithography includes depositing a photoresist material (not shown), patterning the photoresist material by exposing the photoresist material to a desired pattern of irradiation, and developing the exposed photoresist material utilizing a conventional resist developer. Etching may include dry etching (i.e., reactive ion etching, ion beam etching, plasma etching, or laser ablation) or a chemical wet etch process. Following the formation of the semiconductor fins 22, the patterned photoresist material can be removed utilizing a resist stripping process such as, for example, ashing.

As used herein, a "semiconductor fin" refers to a contiguous semiconductor structure that extends upward from a surface of a substrate. In the present application, the substrate includes insulator layer 12L and handle substrate 10L. In the present embodiment, each semiconductor fin 22 has a bottommost surface that forms a material interface with a topmost surface of insulator layer 12L. Each fin structure 22 that is formed includes a pair of vertical sidewalls that are parallel to each other. As used herein, a surface is "vertical" if there exists a vertical plane from which the surface does not deviate by more than three times the root mean square roughness of the surface. Each semiconductor fin 22 that is formed is spaced apart from each other and extends upward from a surface of insulator layer 12L.

Each semiconductor fin 22 that is formed has a height that is equal to the thickness of the topmost semiconductor material layer 14L of the SOI substrate. Each semiconductor fin 22 has a width, as measured from one vertical sidewall to another vertical sidewall in the vertical cross sectional view shown in FIG. 3, of from 10 nm to 50 nm. The length of each semiconductor fin 22 (which runs into and out of the vertical cross sectional view shown in FIG. 3) can be from 30 nm to 500 nm. Other widths and lengths that are lesser than, or greater than, the aforementioned ranges can also be employed in the present application. Each semiconductor fin 22 that is formed is spaced apart from its nearest neighboring fin by a pitch from 20 nm to 200 nm; the term "pitch" is used herein to denote a distance from one point of one semiconductor fin to an equivalent point on its nearest neighboring semiconductor fin.

Figure 4:
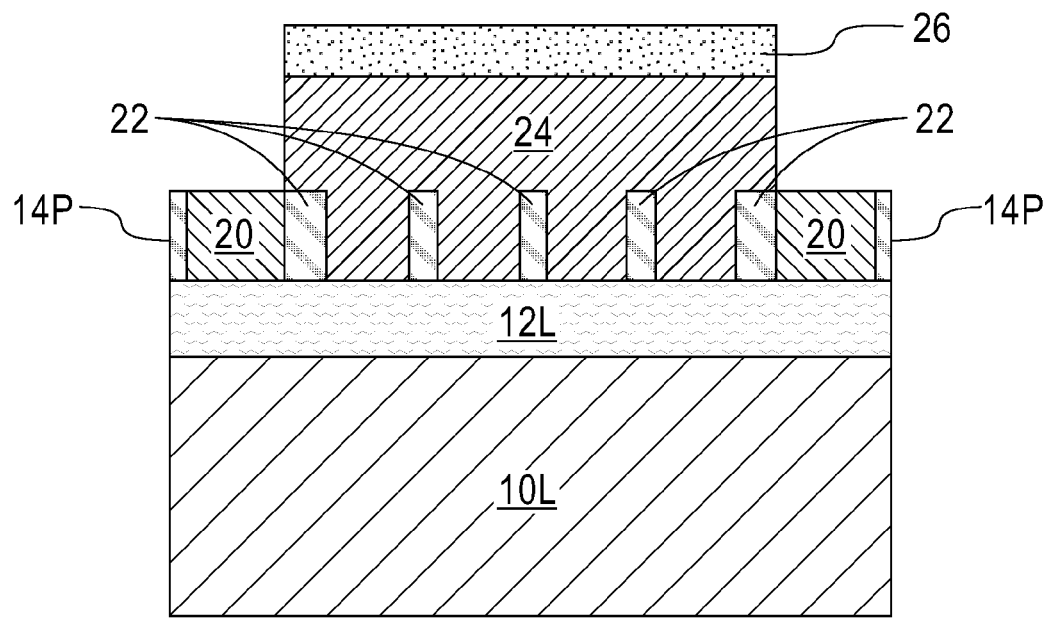
FIG. 4 is a cross sectional view of the exemplary semiconductor structure of FIG. 3 after forming sacrificial gate structures straddling portions of each semiconductor fin.

Referring now to FIG. 4, there is illustrated the exemplary semiconductor structure of FIG. 3 after forming sacrificial gate structures (24, 26) straddling different portions of each semiconductor fin 22. The term "straddling" denotes that each sacrificial gate structure is formed across a semiconductor fin 22 such that a first portion of each sacrificial gate structure is present on one side of the semiconductor fin 22, and a second portion of each sacrificial gate structure is present on another side of the semiconductor fin 22. Portions of each sacrificial gate structure are also located on an exposed portion of the substrate (in the illustrated embodiment, the sacrificial gate structure (24, 26) include portions that are present on insulator layer 12L).

The number of sacrificial gate structures (24, 26) that are formed in the present application may vary so long that at least two sacrificial gate structures are present protecting at least two different portions of each semiconductor fin 22. The portion(s) of each semiconductor fin 22 in which the sacrificial gate structures is(are) absent is(are) the area(s) in which a fuse link of the present application can be formed. The portions of the semiconductor fins 22 that are protected by the sacrificial gate structures (24, 26) are areas in which an anode or cathode of the e-Fuse structure of the present application is subsequently formed.

By "sacrificial gate structure" it is meant a material or material stack that serves as a placeholder for a subsequently formed structure. The sacrificial gate structure may include a sacrificial gate dielectric portion (not shown), a sacrificial gate material portion 24 and a sacrificial gate cap portion 26. In some embodiments, sacrificial gate cap portion 26 may be omitted.

If present, the sacrificial gate dielectric portion includes an oxide, nitride, and/or oxynitride. In one example, the sacrificial gate dielectric portion can be composed of silicon dioxide and/or silicon nitride. The gate dielectric material used in providing the sacrificial gate dielectric portion can be formed by any deposition process including, for example, chemical vapor deposition (CVD), plasma enhanced chemical vapor deposition (PECVD), physical vapor deposition (PVD), sputtering, or atomic layer deposition. In some embodiments, a thermal process including, for example, thermal oxidation and/or thermal nitridation may be used in forming the gate dielectric material that can provide the sacrificial gate dielectric portion. In one embodiment of the present application, the gate dielectric material used in providing the sacrificial gate dielectric can have a thickness in a range from 1 nm to 10 nm. Other thicknesses that are lesser than, or greater than, the aforementioned thickness range can also be employed for the gate dielectric material.

The sacrificial gate material portion 24 includes a conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), or multilayered combinations thereof. The gate conductor material used in providing the sacrificial gate material portion 24 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. In one embodiment, the gate conductor material used in providing the sacrificial gate material portion 24 has a thickness from 1 nm to 100 nm. Other thicknesses that are lesser than, or greater than, the aforementioned thickness range can also be employed for the gate conductor material used in providing the sacrificial gate material portion 24.

When present, sacrificial gate cap portion 26 comprises a gate cap material. The gate cap material that provides each gate cap portion may include one of the dielectric materials mentioned above for hard mask material. In one embodiment, the sacrificial gate cap portion 26 comprises silicon dioxide, silicon nitride, and/or silicon oxynitride. The dielectric material that provides the sacrificial gate cap portion 26 can be formed utilizing a conventional deposition process such as, for example, chemical vapor deposition or plasma enhanced chemical vapor deposition. The dielectric material that provides the sacrificial gate cap portion 26 can have a thickness from 5 nm to 20 nm. Other thicknesses that are lesser than, or greater than, the aforementioned thickness range can also be employed as the thickness of the dielectric material that provides the sacrificial gate cap portion 26.

The sacrificial gate structure can be formed by providing a blanket layer of the sacrificial gate dielectric material (if present), the sacrificial gate material and, the sacrificial gate cap material (if present), and then patterning the material or material stack by lithography and etching.

Figure 5A:
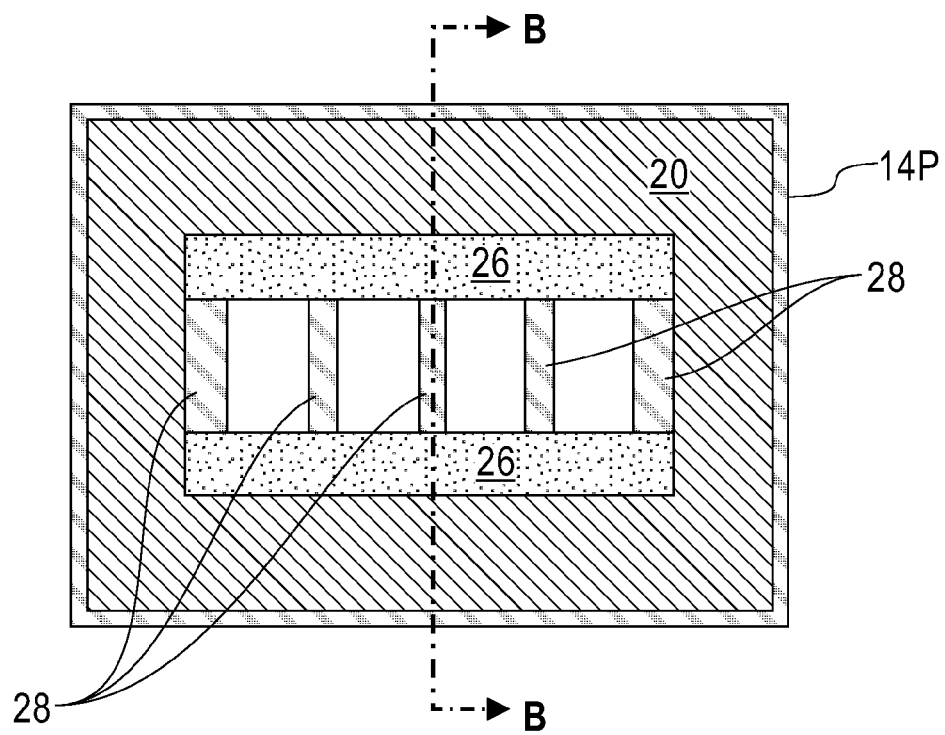
FIG. 5A is a top down view of the exemplary semiconductor structure of FIG. 4 after performing a semiconductor fin recessing step utilizing each sacrificial gate structure as an etch mask.
Figure 5B:
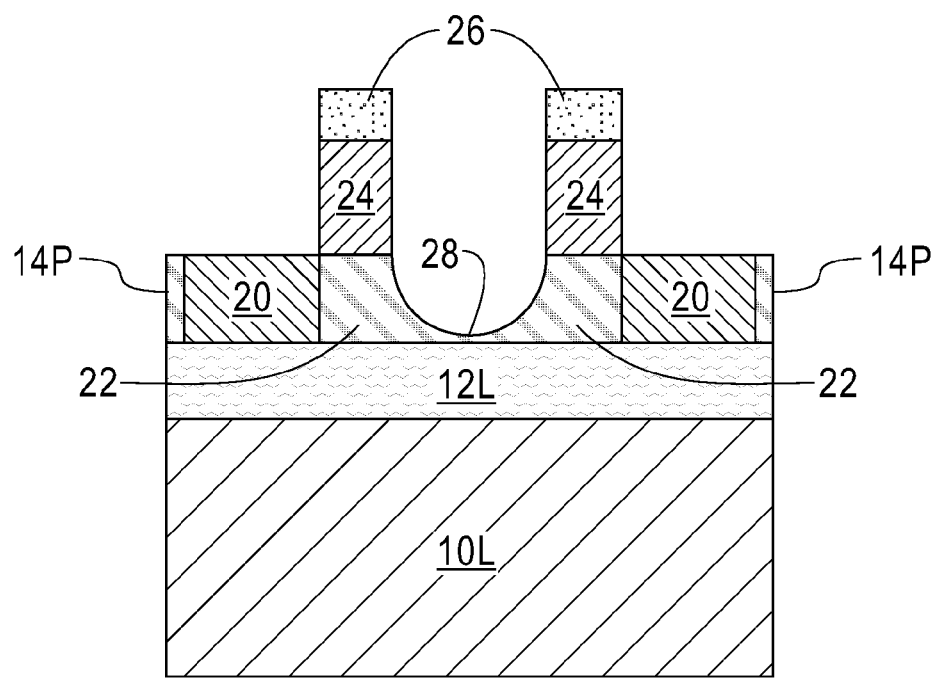
FIG. 5B is a cross sectional view of the exemplary semiconductor of FIG. 5A through vertical plane B-B of FIG. 5A.

Referring now to FIGS. 5A-5B, there are shown the exemplary semiconductor structure of FIG. 4 after performing a semiconductor fin recessing step utilizing each sacrificial gate structure (24, 26) as an etch mask. This step forms a recessed semiconductor fin portion 28 along the length of each semiconductor fin 22; each recessed semiconductor fin portion 28 is the area in which a fuse link in accordance with the present application will be subsequently formed. Portions of the semiconductor fin 22 that are located beneath the sacrificial gate structure (24, 26) are not recessed during this processing step of the present application; these portions of the semiconductor fin which are protected by the sacrificial gate structure represent the area in which the anode/cathode of the e-Fuse structure of the present application can be formed.

The recessing of the exposed portions of the semiconductor fins 22 can be performed utilizing an etching process that selectively and partially removes the semiconductor material that provides each semiconductor fin 22. In one embodiment, the etching process that can be used to provide the structure shown in FIGS. 5A-5B may include a dry etching process such as, for example, a timed or end point detection reactive ion etch.

Each recessed semiconductor fin portion 28 that is formed has a non-planar topmost surface. Along the lengthwise direction of each semiconductor fin, each recessed semiconductor fin portion 28 has a non-uniform thickness that gradually decreases from the sidewalls of the protected portions of each semiconductor fin 22 to a minimum thickness that is located between remaining semiconductor fins. In one embodiment, the non-uniform thickness of each recessed semiconductor fin portion 28 can be from 2 nm to 15 nm.

Figure 6:
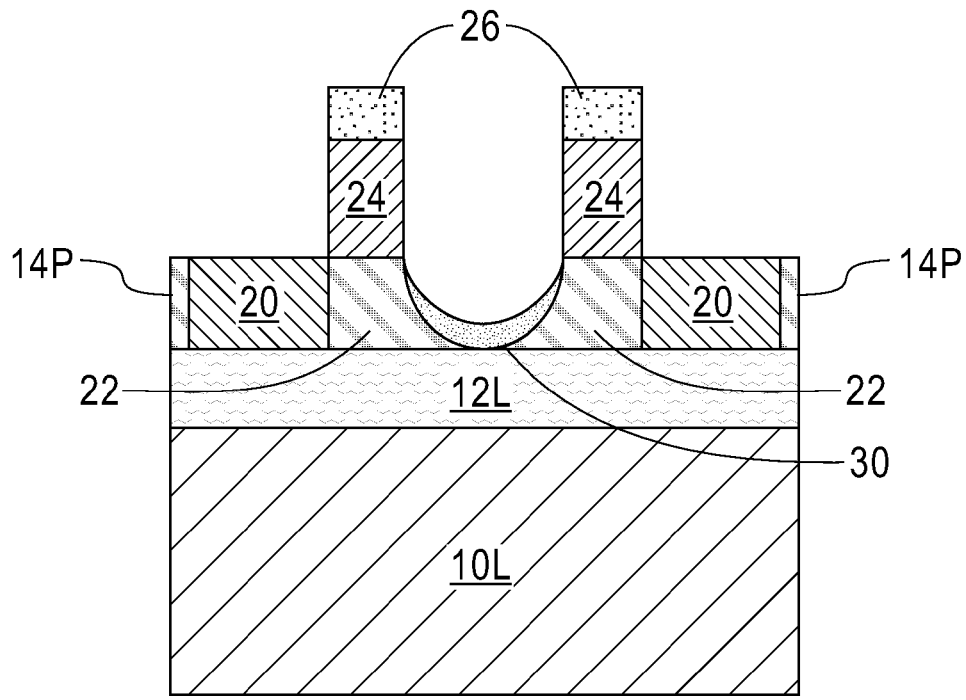
FIG. 6 is a cross sectional view of the exemplary semiconductor structure of FIGS. 5A-5B after forming a metal semiconductor alloy fuse link on each recessed semiconductor fin portion.

Referring now to FIG. 6, there is illustrated the exemplary semiconductor structure of FIGS. 5A-5B after forming a metal semiconductor alloy fuse link 30 on the recessed portion (i.e., recessed semiconductor fin portion 28) of each semiconductor fin 22. Each metal semiconductor alloy fuse link 30 that is formed has a shape and thickness that is similar to the recessed semiconductor fin portion 28. During this step of the present application, each recessed semiconductor fin portion 28 is converted into a metal semiconductor alloy fuse link 30.

The metal semiconductor alloy fuse link 30 is a reaction product that is formed between a metal semiconductor alloy forming metal (to be subsequently described) and the semiconductor material that provides the recessed semiconductor fin portion 28. The metal semiconductor alloy fuse link 30 can be formed by first providing a metal semiconductor alloy forming metal on the surface of each recessed semiconductor fin portion 28. The term "metal semiconductor alloy forming metal" is used throughout the present application to denote a metal that can react with an underlying semiconductor material to form a metal semiconductor alloy. Illustrative examples of metal semiconductor alloy forming metals that can be used in the present application include at least one of nickel (Ni), platinum (Pt), palladium (Pd), titanium (Ti), tungsten (W), and cobalt (Co). The metal semiconductor alloy forming metal can be formed by a deposition process including, for example, chemical vapor deposition, plasma enhanced chemical vapor deposition, plating or sputtering. In some embodiments, a co-deposition of metal semiconductor alloy forming metals can be used. In another embodiment, a first metal semiconductor alloy forming metal can be formed, followed by a second metal semiconductor alloy forming metal. The metal semiconductor alloy metal that is formed can have a thickness from 5 to 15 nm. Other thicknesses that are greater than or lesser than the aforementioned thickness range can also be employed as the thickness of the metal semiconductor alloy forming metal.

After providing the metal semiconductor alloy forming metal and in some embodiments of the present application, a diffusion barrier (not shown) can be formed on an exposed upper surface of the metal semiconductor alloy forming metal. In another embodiment of the present application, no diffusion barrier is provided on the exposed upper surface of the metal semiconductor alloy forming metal. When present, the diffusion barrier can include a metal nitride such as, for example, TiN or TaN, and any deposition process including those mentioned above for providing the metal semiconductor alloy forming metal may be used. When present, the diffusion barrier can have a thickness from 1 nm to 20 nm.

Next, an anneal is performed under conditions that are effective in causing the metal semiconductor alloy forming metal to diffuse into the recessed semiconductor fin portions 28 and react with the semiconductor material to provide a metal semiconductor alloy. In one embodiment, the metal semiconductor alloy fuse link 30 comprises a metal silicide such as, for example, nickel silicide or platinum-nickel silicide. In another embodiment, metal semiconductor alloy fuse link 30 includes a metal germanide such as nickel germanide.

The metal semiconductor alloy formation anneal may be performed in a single step or a two-step anneal can be used. In one embodiment and when nickel is used, the metal semiconductor alloy formation anneal can be performed at a temperature of from 200° C. to 500° C. In another embodiment, temperatures greater than 500° C. can be used. The metal semiconductor alloy formation anneal is typically performed in an ambient including, for example, argon, helium, neon and/or nitrogen. The metal semiconductor alloy formation anneal can be performed utilizing a rapid thermal anneal, a spike anneal, a microwave anneal or a laser anneal. Following the metal semiconductor alloy formation anneal, the optional diffusion barrier and any unreacted metal semiconductor alloy forming metal can be removed utilizing one or more etch processes.

Figure 7:
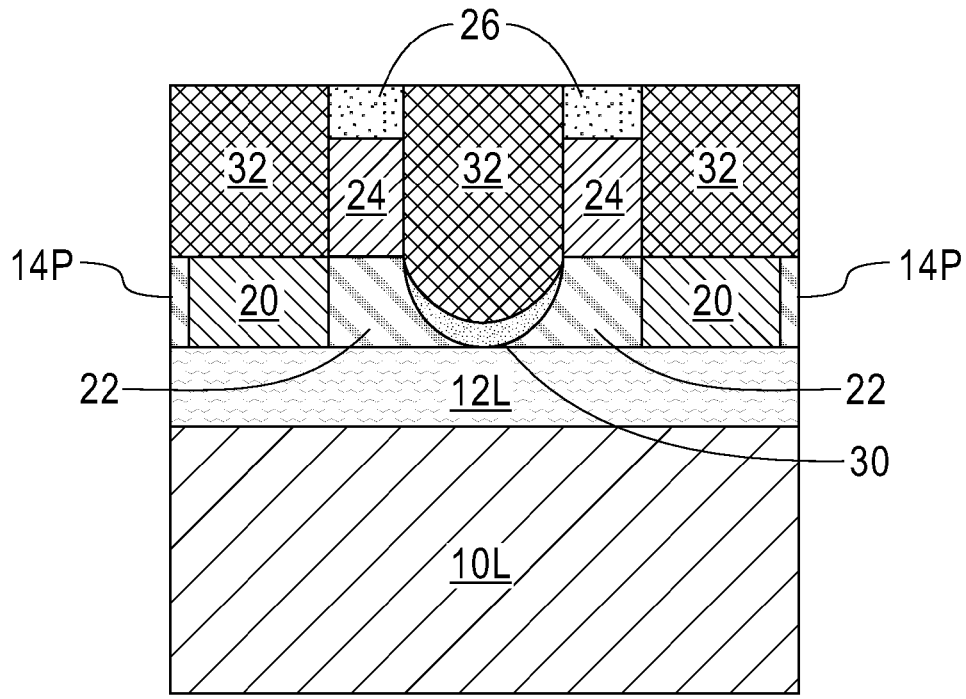
FIG. 7 is a cross sectional view of the exemplary semiconductor structure of FIG. 6 after forming a dielectric oxide structure having a topmost surface that is coplanar with a topmost surface of each sacrificial gate structure.

Referring now to FIG. 7, there is illustrated the exemplary semiconductor structure of FIG. 6 after forming a dielectric oxide structure 32 having a topmost surface that is coplanar with a topmost surface of the sacrificial gate structure (24, 26). The dielectric oxide structure 32 comprises an oxide material that can fill the gaps (i.e., a gap filling oxide material) within the exemplary semiconductor structure. In one embodiment, the dielectric oxide structure 32 may comprise a flowable oxide such as, for example, a silicon oxide containing hydrogen and carbon. The dielectric oxide structure 32 can be formed by utilizing a deposition process such as, for example, CVD or PECVD. A planarization process such as, for example, chemical mechanical polishing and/or grinding may follow the deposition of the oxide material that provides the dielectric oxide structure 32. As is shown, a dielectric oxide structure 32 is formed atop the metal semiconductor alloy fuse link 30, and atop the isolation structure 20.

Figure 8:
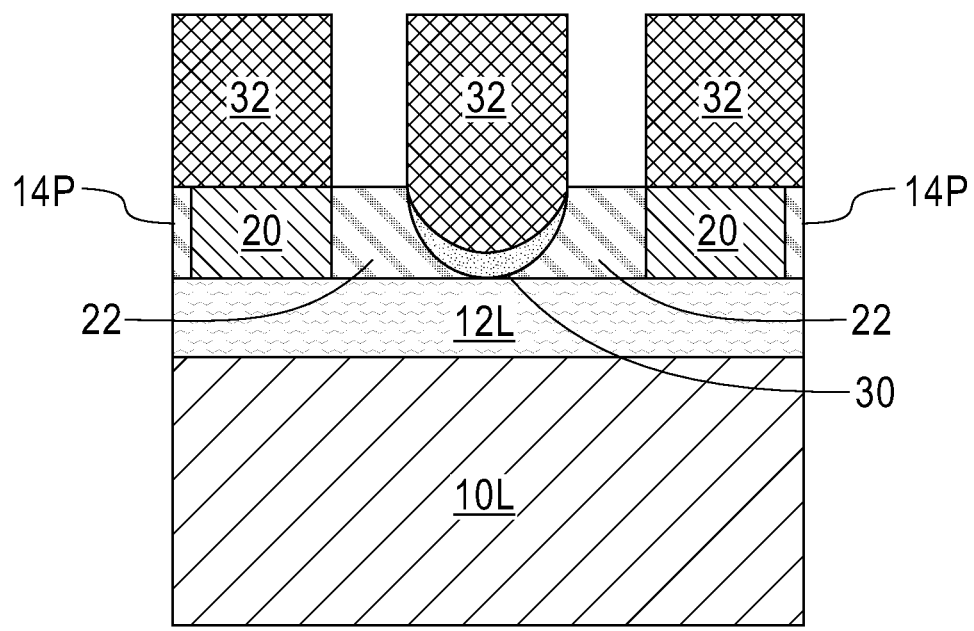
FIG. 8 is a cross sectional view of the exemplary semiconductor structure of FIG. 7 after removing each sacrificial gate structure.

Referring now to FIG. 8, there is illustrated the exemplary semiconductor structure of FIG. 7 after removing each sacrificial gate structure (24, 26) utilizing the dielectric oxide structures 32 as an etch mask. The removing of each sacrificial gate structure (24, 26) can be performed utilizing any well known material removal process or combination of removal processes. In one example, each sacrificial gate cap portion 26 can be removed utilizing a first etching process, and each sacrificial gate material portion 24 can be removed utilizing a second etching process. This step of the present application exposes portions of each semiconductor fin 22 that were previously protected by each sacrificial gate structure (24, 26).

Figure 9:
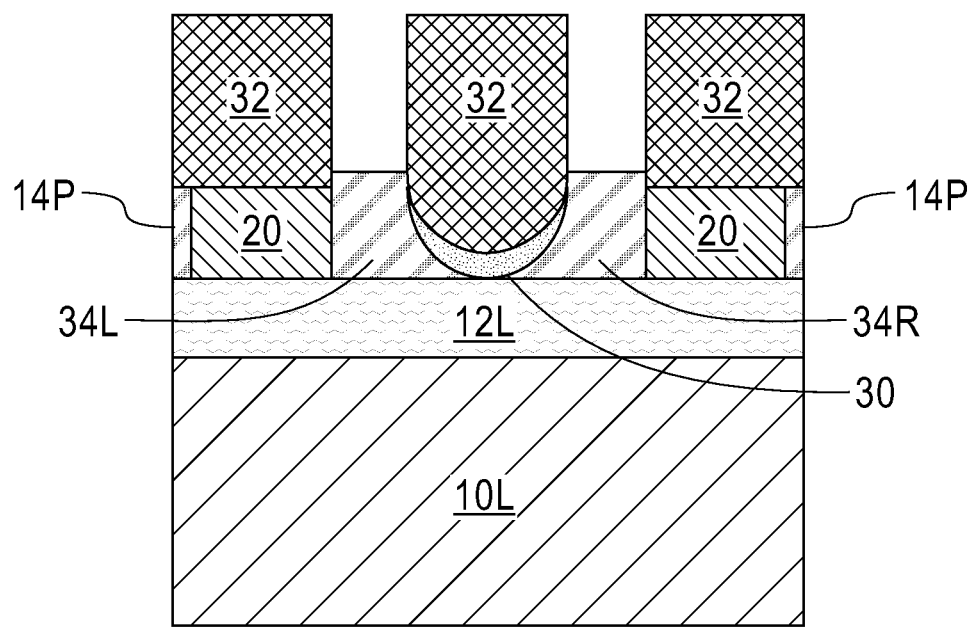
FIG. 9 is cross sectional view of the exemplary semiconductor structure of FIG. 8 after forming a metal semiconductor alloy structure.

Referring now to FIG. 9, there is illustrated the exemplary semiconductor structure of FIG. 8 after forming a metal semiconductor alloy structure 34L, 34R on a topmost surface of each semiconductor fin 22. During this step of the present application, each exposed portion of each semiconductor fin 22 is converted into a metal semiconductor alloy structure 34L, 34R. The height of each metal semiconductor alloy structure 34L, 34R is approximately the height of the original semiconductor fin 22. Metal semiconductor alloy structure 34L can represents a first metal semiconductor alloy structure of the e-Fuse structure of the present application, while metal semiconductor alloy structure 34R may represent a second metal semiconductor alloy structure of the e-Fuse structure of the present application. One of the metal semiconductor alloy structures (i.e., 34L) can serve as the anode of the e-Fuse structure of the present application, while the other metal semiconductor alloy structure (i.e., 34R) can serve as the cathode of the e-Fuse structure of the present application. The first and second metal semiconductor alloy structures 34L, 34R have a first thickness, while the metal semiconductor alloy fuse link 30 that is located between the first and second metal semiconductor alloy structures 34L, 34R has a second thickness that is less than the first thickness.

Each metal semiconductor alloy structure 34L, 34R can be formed utilizing the same processing steps as mentioned above in forming the metal semiconductor alloy fuse link 30. In some embodiments of the present application, each metal semiconductor alloy structure 34L, 34R and the metal semiconductor alloy fuse link 30 can comprise a same metal semiconductor alloy forming metal component. In another embodiment, each metal semiconductor alloy structure 34L, 34R comprises a different metal semiconductor alloy forming metal component than the metal semiconductor alloy fuse link 30. Each metal semiconductor alloy structure 34L, 34R is in electrical connection to each other by metal semiconductor alloy fuse link 30.

Figure 10:
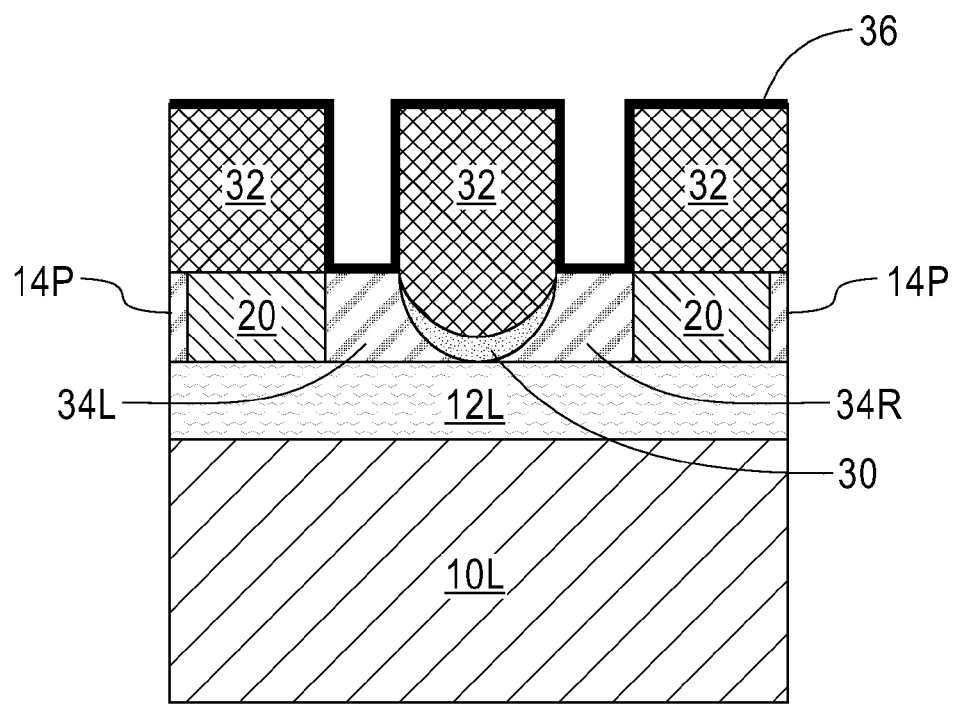
FIG. 10 is a cross sectional view of the exemplary semiconductor structure of FIG. 9 after forming a diffusion barrier liner.

Referring now to FIG. 10, there is illustrated the exemplary semiconductor structure of FIG. 9 after forming a diffusion barrier layer 36. The diffusion barrier layer 36 is a contiguous layer that is located on exposed horizontal topmost surfaces and sidewall surfaces of each dielectric oxide structure 32 as well as the topmost surface of each metal semiconductor alloy structure 34L, 34R.

The diffusion barrier layer 36 comprises any barrier material that can prevent a subsequently formed conductive metal from diffusing into the surrounding materials. The barrier material that can be used in providing the diffusion barrier layer 36 includes, but is not limited to, Co, CoN, Ir, Pt, Pd, Ta, TaN, Ti, TiN, Ru, RuN, RuTa, RuTaN, W or WN; as is known to those skilled in the art the diffusion barrier material that provides the diffusion barrier layer 36 must include a different metal than the conductive metal used as the interconnect metal (to be subsequently formed). The thickness of the diffusion barrier layer 36 can be from 5 nm to 20 nm. Other thicknesses that or lesser than, or greater than, the aforementioned thickness range can also be employed as the thickness of the diffusion barrier layer 36. The diffusion barrier layer 36 can be formed by any deposition process including, for example, chemical vapor deposition (CVD), plasma enhanced chemical vapor deposition (PECVD), atomic layer deposition (ALD), physical vapor deposition (PVD), sputtering, chemical solution deposition or plating.

Figure 11:
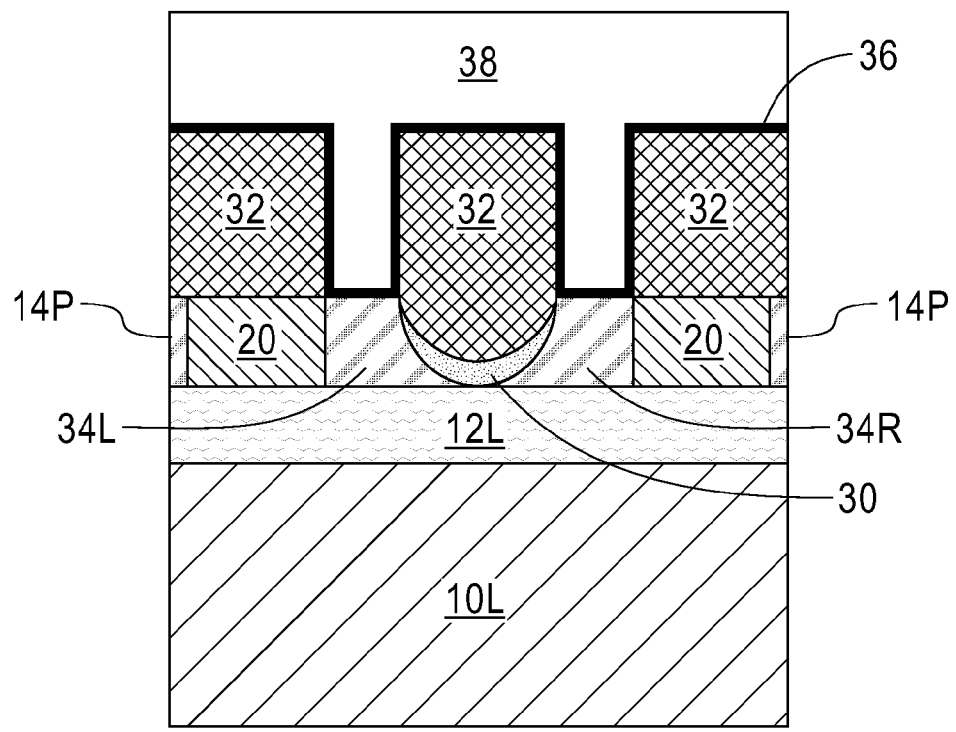
FIG. 11 is a cross sectional view of the exemplary semiconductor structure of FIG. 10 after forming an interconnect metal.

Referring now to FIG. 11, there is illustrated the exemplary semiconductor structure of FIG. 10 after forming an interconnect metal 38. The interconnect metal 38 fills the gaps located above each metal semiconductor alloy structure 34L, 34R and is formed above each dielectric oxide structure 32. Moreover, the interconnect metal 38 is formed atop the diffusion barrier layer 36.

The interconnect metal 38 may comprise any metal that can be used in forming an interconnect structure. Exemplary metals that can be used as the interconnect metal 38 include, but are not limited to, W, Cu, Al and alloys thereof. The interconnect metal 38 can be formed utilizing any deposition process including, for example, chemical vapor deposition (CVD), plasma enhanced chemical vapor deposition (PECVD), atomic layer deposition (ALD), physical vapor deposition (PVD), sputtering, chemical solution deposition or plating.

Figure 12:
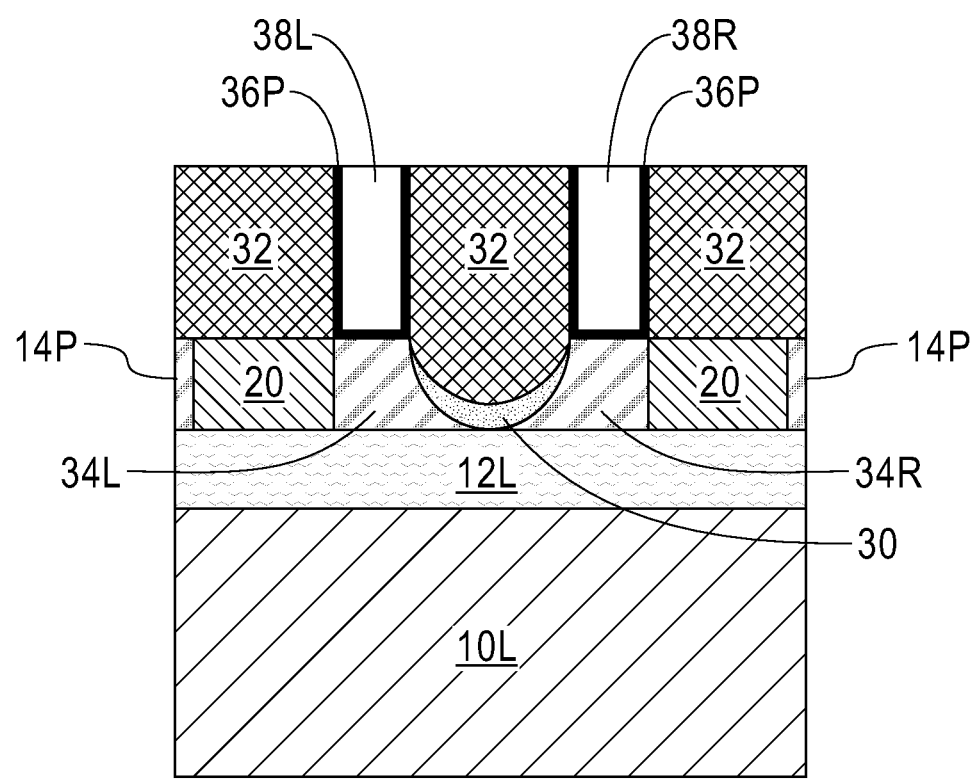
FIG. 12 is a cross sectional view of the exemplary semiconductor structure of FIG. 11 after performing a planarization process.

Referring now to FIG. 12, there is illustrated the exemplary semiconductor structure of FIG. 11 after performing a planarization process. The planarization process may include chemical mechanical polishing and/or grinding. The planarization process removes the diffusion barrier layer 36 and the interconnect metal 38 that is located above the horizontal topmost surface of each dielectric oxide structure 32. The planarization process provides interconnect structures 38L, 38R and diffusion barrier liner 36P. The interconnect structures 38L, 38R comprise a remaining portion of the interconnect metal 38. The diffusion barrier liner 36P comprises a remaining portion of the diffusion barrier layer 36. As is shown, the topmost surface of interconnect structures 38L, 38R are coplanar with a topmost surface of the diffusion barrier liner 36P. The topmost surfaces of each of the interconnect structures 38L, 38R and the diffusion barrier liner 36P are coplanar with a topmost surface of each dielectric oxide structure 32.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, said method comprising:
   forming a plurality of semiconductor fins extending upwards from a surface of an insulator layer;
   forming at least a pair of spaced apart sacrificial gate structures straddling different portions of each semiconductor fin of said plurality of semiconductor fins;
   recessing a portion of each semiconductor fin not protected by said sacrificial gate structures to provide a recessed semiconductor fin portion;
   converting each recessed semiconductor fin portion into a metal semiconductor alloy fuse link;
   removing each sacrificial gate structure to expose remaining portions of each semiconductor fin; and
   converting said remaining portions of each semiconductor fin into metal semiconductor alloy structures.

2. The method of claim 1, wherein said forming said plurality of semiconductor fins comprises:
   providing a semiconductor-on-insulator substrate comprising, from bottom to top, a handle substrate, said insulator layer and a topmost semiconductor material layer;
   forming an isolation structure into a portion of said topmost semiconductor material layer, wherein said isolation structure surrounds a remaining portion of said topmost semiconductor material layer; and
   patterning said remaining portion of said topmost semiconductor material layer.

3. The method of claim 1, wherein said recessing said portion of each semiconductor fin not protected by said sacrificial gate structures comprises a reactive ion etch.

4. The method of claim 1, wherein said converting each recessed semiconductor fin portion comprises:
   forming a metal semiconductor alloy forming metal on each recessed semiconductor fin portion;
   annealing to cause a reaction between said metal semiconductor alloy forming metal and each recessed semiconductor fin portion; and
   removing any metal semiconductor alloy forming metal that does not react with said recessed semiconductor fin portion.

5. The method of claim 1, forming comprising forming a dielectric oxide structure atop at least said metal semiconductor alloy fuse link prior to said converting said remaining portions of each semiconductor fin.

6. The method of claim 5, wherein said converting said remaining portions of each semiconductor fin comprises:
   forming a metal semiconductor alloy forming metal on said remaining portions of each semiconductor fin;
   annealing to cause a reaction between said metal semiconductor alloy forming metal and said remaining portions of each semiconductor fin; and
   removing any metal semiconductor alloy forming metal that does not react with said remaining portions of each semiconductor fin.

7. The method of claim 1, further comprising forming a diffusion barrier liner atop each metal semiconductor alloy structure.

8. The method of claim 7, further comprising forming an interconnect structure atop said diffusion barrier liner, wherein said interconnect structure has a topmost surface that is coplanar with a topmost surface of said diffusion barrier liner.

9. The method of claim 8, wherein said interconnect structure comprises W, Cu, Al or alloys thereof.

10. The method of claim 1, wherein each metal semiconductor alloy structure has a first thickness and each metal semiconductor alloy fuse link has a second thickness that is less than the first thickness, and wherein each metal semiconductor alloy fuse link is located laterally between one of said metal semiconductor alloy structures and another of said metal semiconductor alloy structures.

\* \* \* \* \*